(12) United States Patent
Graf et al.

(10) Patent No.: US 10,651,135 B2
(45) Date of Patent: May 12, 2020

(54) TAMPER DETECTION FOR A CHIP PACKAGE

(71) Applicant: MARVELL INTERNATIONAL LTD., Hamilton (BM)

(72) Inventors: Richard S. Graf, Gray, ME (US); Ezra D. B. Hall, Richmond, VT (US); Faraydon Pakbaz, Milton, VT (US); Sebastian T. Ventrone, South Burlington, VT (US)

(73) Assignee: MARVELL ASIA PTE, LTD., Singapore (SG)

( * ) Notice: Subject to any disclaimer, the term of this patent is extended or adjusted under 35 U.S.C. 154(b) by 323 days.

(21) Appl. No.: 15/195,029

(22) Filed: Jun. 28, 2016

(65) Prior Publication Data
US 2017/0373024 A1 Dec. 28, 2017

(51) Int. Cl.
*G01R 31/44* (2020.01)
*H01L 23/00* (2006.01)
(Continued)

(52) U.S. Cl.
CPC ........ *H01L 23/573* (2013.01); *G01R 31/2853* (2013.01); *G01R 31/2896* (2013.01);
(Continued)

(58) Field of Classification Search
CPC ............ G01R 31/2853; G01R 31/2896; G01R 31/44; H01L 23/49503; H01L 23/4952; H01L 23/49541; H01L 23/573; H01L 23/49838; H01L 23/49861; H01L 24/06; H01L 24/49

See application file for complete search history.

(56) References Cited

U.S. PATENT DOCUMENTS

| 5,406,630 A | * | 4/1995 | Piosenka | ................. G01K 7/01 257/E23.08 |
| 5,861,662 A | | 1/1999 | Candelore | |

(Continued)

FOREIGN PATENT DOCUMENTS

| CN | 1790290 A | 6/2006 |
| CN | 101889344 A | 11/2010 |

(Continued)

OTHER PUBLICATIONS

Taiwan Intellectual Propery Office, Examination Report and English translation issued in Taiwanese Patent Application No. 106112180 dated Mar. 14, 2018.

(Continued)

*Primary Examiner* — Douglas X Rodriguez
*Assistant Examiner* — Brent J Andrews

(57) ABSTRACT

Chip packages with improved tamper resistance and methods of using such chip packages to provide improved tamper resistance. A lead frame includes a die attach paddle, a plurality of outer lead fingers, and a plurality of inner lead fingers located between the outer lead fingers and the die attach paddle. A chip is attached to the die attach paddle. The chip includes a surface having an outer boundary and a plurality of bond pads arranged proximate to the outer boundary. A first plurality of wires extend from the outer lead fingers to respective locations on the surface of the chip that are interior of the outer boundary relative to the bond pads. A tamper detection circuit is coupled with the first plurality of wires. A second plurality of wires extend from the inner lead fingers to the bond pads on the chip. The second plurality of wires are located between the lead frame and the first plurality of wires.

19 Claims, 3 Drawing Sheets

(51) Int. Cl.
    *H01L 23/498* (2006.01)
    *G01R 31/28* (2006.01)
    *H01L 23/495* (2006.01)
    *H01L 23/50* (2006.01)
    *H01L 23/31* (2006.01)

(52) U.S. Cl.
    CPC .......... *G01R 31/44* (2013.01); *H01L 23/4952* (2013.01); *H01L 23/49503* (2013.01); *H01L 23/49541* (2013.01); *H01L 23/49838* (2013.01); *H01L 23/49861* (2013.01); *H01L 24/06* (2013.01); *H01L 24/49* (2013.01); *H01L 23/3121* (2013.01); *H01L 23/50* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/05554* (2013.01); *H01L 2224/2919* (2013.01); *H01L 2224/32225* (2013.01); *H01L 2224/32245* (2013.01); *H01L 2224/45144* (2013.01); *H01L 2224/45147* (2013.01); *H01L 2224/48227* (2013.01); *H01L 2224/48247* (2013.01); *H01L 2224/49171* (2013.01); *H01L 2224/73265* (2013.01); *H01L 2224/85207* (2013.01); *H01L 2924/0781* (2013.01); *H01L 2924/14* (2013.01); *H01L 2924/1432* (2013.01); *H01L 2924/1434* (2013.01); *H01L 2924/181* (2013.01)

(56) References Cited

U.S. PATENT DOCUMENTS

| | | | |
|---|---|---|---|
| 7,550,789 B2 | 6/2009 | Bonaccio et al. | |
| 7,923,830 B2 | 4/2011 | Pope et al. | |
| 8,455,990 B2 | 6/2013 | Warren et al. | |
| 8,502,396 B2 | 8/2013 | Buer et al. | |
| 8,581,251 B2 | 11/2013 | Loisel et al. | |
| 8,896,086 B1 | 11/2014 | Arora et al. | |
| 2006/0022290 A1* | 2/2006 | Chen | H01L 24/24 257/432 |
| 2006/0273438 A1* | 12/2006 | Anderson | H01L 23/576 257/686 |
| 2009/0079074 A1* | 3/2009 | Motonaga | H01L 23/49838 257/738 |
| 2011/0198752 A1* | 8/2011 | Nondhasitthichai | H01L 23/49513 257/738 |
| 2012/0307932 A1* | 12/2012 | McCormack | H01L 23/66 375/295 |
| 2013/0087911 A1* | 4/2013 | Gregorich | H01L 25/105 257/737 |
| 2015/0121116 A1* | 4/2015 | Cebulla | G06F 11/2033 713/401 |
| 2015/0137340 A1* | 5/2015 | Buer | H01L 23/573 257/690 |
| 2015/0143551 A1 | 5/2015 | Tiemeijer | |

FOREIGN PATENT DOCUMENTS

| | | |
|---|---|---|
| CN | 102257516 A | 11/2011 |
| CN | 104217179 A | 12/2014 |

OTHER PUBLICATIONS

Chinese Intellectual Property Office, Office Action received in Chinese Patent Application No. 201710506432.3 dated Jul. 19, 2019 and translation thereof.

* cited by examiner

TAMPER DETECTION FOR A CHIP PACKAGE

BACKGROUND

The present invention relates to chip packaging and, more specifically, to tamper-resistant packages for chips and methods of using such packages to provide tamper resistance.

Chip packaging plays a role in product protection and chip security. For instance, the chip package may protect the enclosed chip against damage. With regard to chip security, tamper prevention techniques may be applied to prevent surreptitious access by an attacker to the chip and to deter reverse engineering.

Chip packages that feature improved tamper resistance and methods of using such chip packages are needed.

SUMMARY

According to one embodiment of the invention, a structure includes a lead frame with a die attach paddle, a plurality of outer lead fingers, and a plurality of inner lead fingers located between the outer lead fingers and the die attach paddle. A chip is attached to the die attach paddle. The chip includes a surface having an outer boundary and a plurality of bond pads arranged proximate to the outer boundary. A first plurality of wires extend from the outer lead fingers to respective locations on the surface of the chip that are interior of the outer boundary relative to the bond pads. A tamper detection circuit is coupled with the first plurality of wires. A second plurality of wires extend from the inner lead fingers to the bond pads on the chip. The second plurality of wires are located between the lead frame and the first plurality of wires.

According to another embodiment of the invention, a method is provided for detecting tampering of a chip attached to a die attach paddle on a lead frame. The method includes transmitting a first signal to a first plurality of wires that extend from a plurality of outer lead fingers on the lead frame to respective locations over a surface of a chip, transmitting a second signal to a second plurality of wires that extend from a plurality of inner lead fingers on the lead frame to a plurality of bond pads on the surface of a chip, and monitoring the first signal with a tamper protection circuit.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
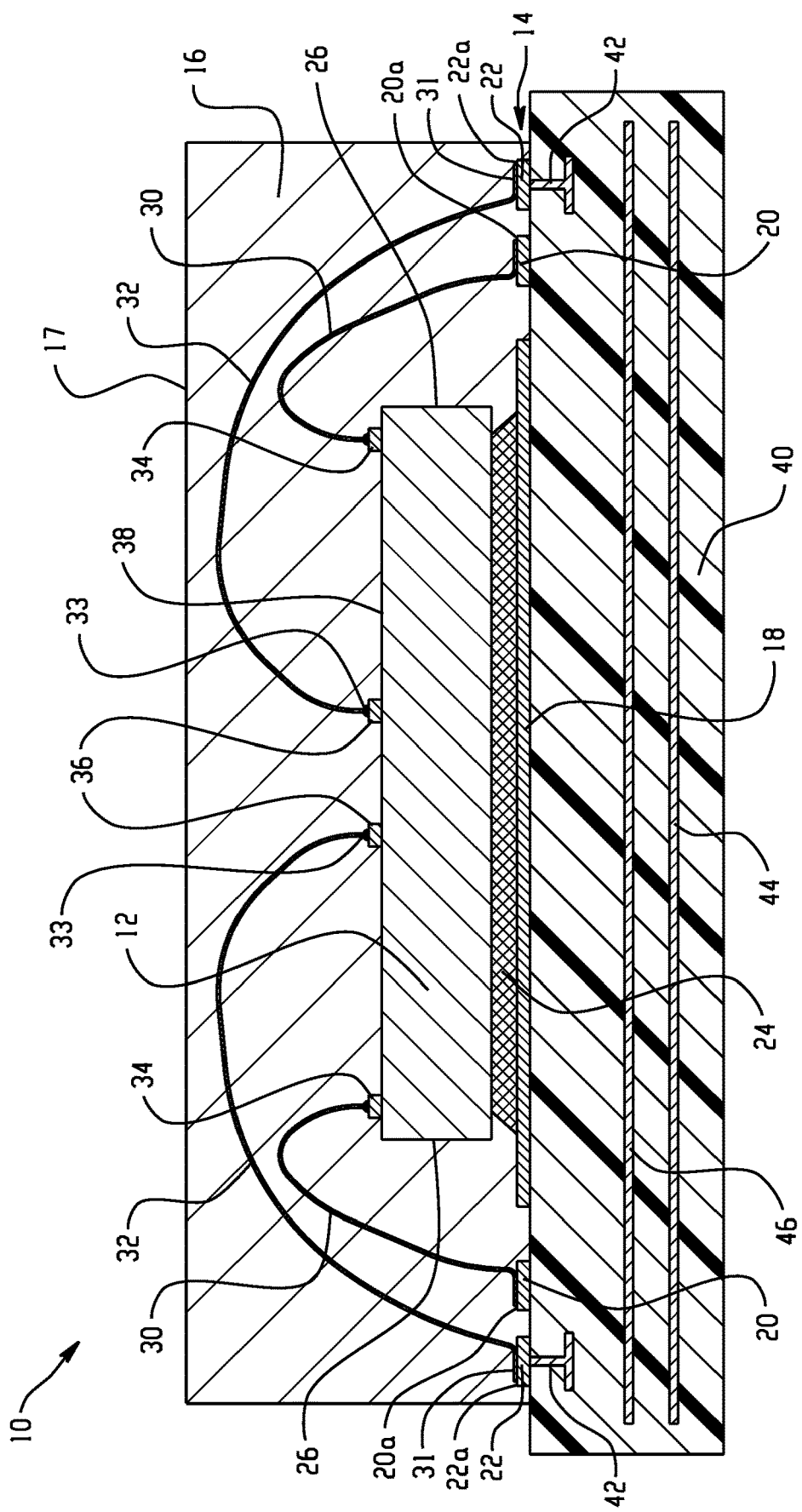
FIG. 1 is a cross-sectional view of a chip package in accordance with an embodiment of the invention.
Figure 2:
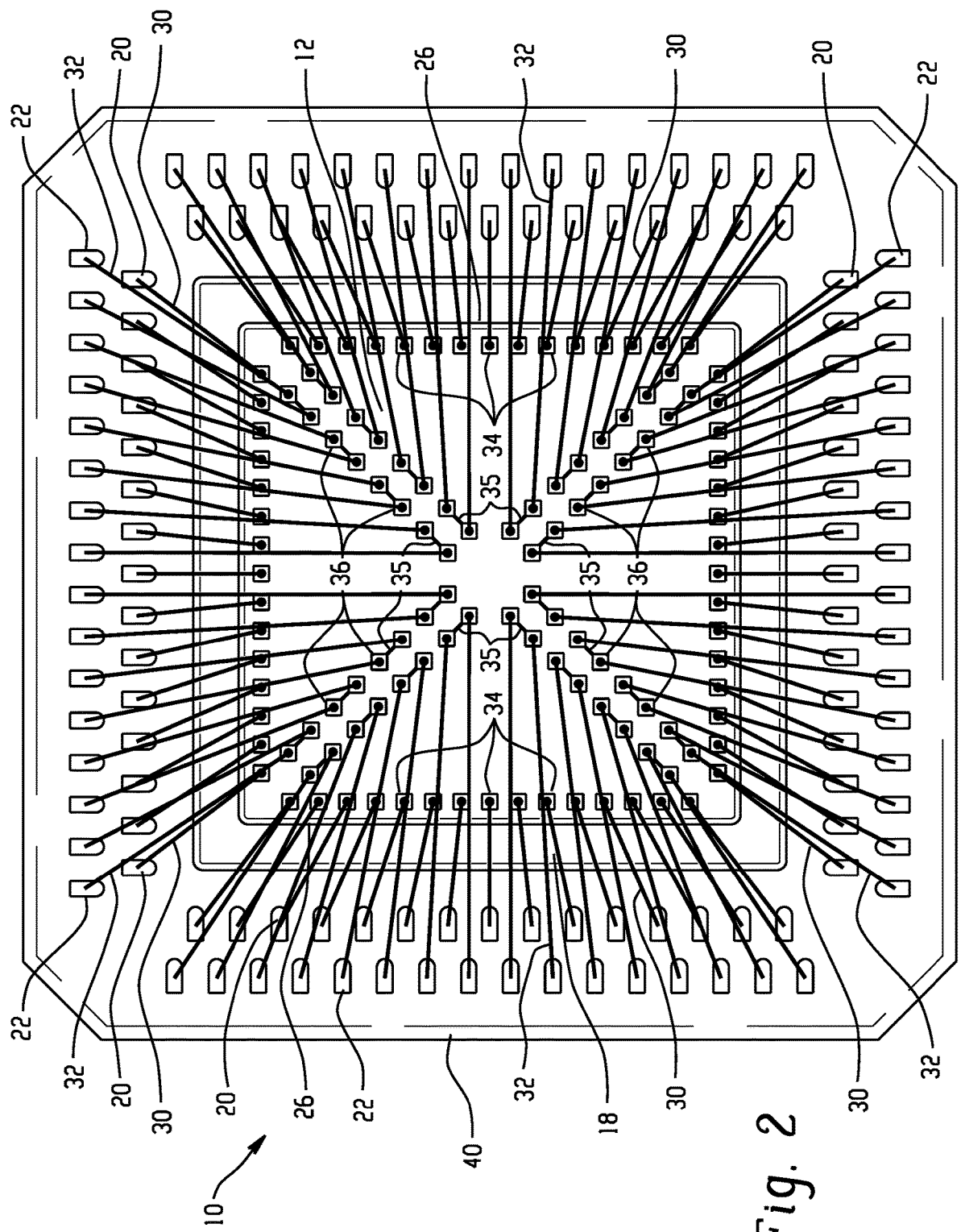
FIG. 2 is a top view of the chip package of FIG. 1 in which the outer case has been removed for purposes of illustration.

With reference to FIGS. 1, 2 and in accordance with an embodiment of the invention, a chip package 10 includes a chip 12, a lead frame 14, and an outer casing 16 having an exterior surface 17. The chip 12 includes one or more integrated circuits with device structures formed using front-end-of-line (FEOL) processes. The FEOL processes may comprise, for example, complementary-metal-oxide-semiconductor (CMOS) processes used to build a combination of p-type and n-type field-effect transistors that are coupled to implement logic gates and other types of digital circuits. The chip 12 includes side edges 26 that establish an outer boundary or perimeter and a surface 38 that is surrounded or bounded by the side edges 26.

The lead frame 14 includes a die attach pad or paddle 18 that is centrally located relative to the inner lead fingers 20 and the outer lead fingers 22. The lead frame 14 may be comprised of a thin layer of a metal, such as copper or a copper alloy. The chip 12 is attached to the die attach paddle 18 by a layer 24 of, for example, a thermally and/or electrically conductive adhesive. Different side edges of the die attach paddle 18 are respectively aligned with the side edges 26 of the chip 12. The chip package 10 may be surface mounted to a substrate 40, such as a printed circuit board or a laminate substrate. The die attach paddle 18 offers a low thermal resistance path for heat transfer from the chip 12, when powered, to the substrate 40.

The inner lead fingers 20 and the outer lead fingers 22 may be arranged in rows that are located adjacent to and spaced outwardly from one or more of the side edges 26 of the chip 12. In the representative embodiment in which the chip 12 and die attach paddle 18 are rectangular in shape, the rows of lead fingers 20, 22 are located adjacent to all of the side edges 26 of the chip 12 and the different rows may be aligned parallel to the respective different side edges 26 of the chip 12. In an alternative embodiment, the lead fingers 20, 22 may be located adjacent to fewer than all of the side edges 26 of the chip 12. For example, the lead fingers 20, 22 may be located adjacent to only an opposite pair of the side edges 26 of the chip 12. On each of the side edges 26 of the chip 12, the inner lead fingers 20 are laterally located in their respective rows between the adjacent rows including the outer lead fingers 22 and the die attach paddle 18 such that the inner lead fingers 20 are located closer to the chip 12 and die attach paddle 18 than the outer lead fingers 22. The lead fingers 20, 22 may have different sizes and different pitches. Respective surfaces 20a, 22a of the lead fingers 20, 22 are oriented to face in the same direction as the surface 38 of the chip 12, which promotes the wirebonding process.

In an embodiment, the chip package 10 may be a multi-row Quad Flat No-leads (QFN) chip package or another type of multi-row flat no-leads package. In a particular embodiment, the chip package 10 may be a dual-row QFN chip package or another type of dual-row flat no-leads package. In chip packages having more than two rows of lead fingers, additional rows of lead fingers are placed between inner lead fingers 20 and outer lead fingers 22 such that outer lead fingers 22 are located as the peripherally outermost row that has the greatest spacing from the chip 12 and die attach paddle 18.

The chip 12 is subjected to middle-of-line (MOL) processing and back-end-of-line (BEOL) processing, after the integrated circuits are formed by FEOL processing, that forms multiple metallization levels arranged in a stack and that includes bond pads 34, 36 in a topmost metallization level. The bond pads 34, 36 may be comprised of copper, aluminum, or an alloy of these metals, and may be formed by, for example, subtractive etching of a deposited layer of the metal. The bond pads 34, 36 are located in the topmost metallization level of the BEOL interconnect structure at the top surface 38 of the chip 12, and are accessible for wirebonding processes. The bond pads 34 may be used to supply conductive paths for signals, clock, power, etc. to the integrated circuits of the chip 12. In an embodiment, the bond pads 36 are not connected to the integrated circuits of the chip 12, but are instead adjacent pairs of the bond pads 36 are connected by conductive paths 35, which are diagrammatically shown in FIG. 2, in the BEOL interconnect structure. The conductive paths 35 may be located beneath the top surface 38 of the chip 12 in, for example, a metallization level adjacent to the topmost metallization level. In an alternative embodiment, one or more of the bond pads 36 may be coupled with one or more tamper protection circuits formed by FEOL processes as integrated circuits on the chip 12, as discussed hereinbelow.

The wires 30, 32 are not connected to sites located on multiple tiers as found in, for example, a chip stack. Instead, the surface 38 of the chip 12 provides a common plane in which the ends of all of the wires 30 are attached to the chip 12 and the ends 33 of all of the wires 32 are located.

The bond pads 34, 36 are located on the surface 38 interior of the outer boundary of the chip 12 established by the side edges 26 with bond pads 36 located interior of bond pads 34. The bond pads 34 are located at the periphery of the chip 12 near the outer perimeter or boundary established the side edges 26, and may be arranged in rows adjacent to the different side edges 26. The inner lead fingers 20 and bond pads 34 are respectively located closer to the outer boundary than the outer lead fingers 22 and bond pads 36. The bond pads 36 are located interior of the bond pads 36, and the inner lead fingers 20 are also laterally located interior of the outer lead fingers 22. The bond pads 36 may be arranged in rows that are angled toward a center of the top surface 38 of the chip 12 and relative to rows containing bond pads 34. The alignment of the bond pads 36 promotes the ability to provide tamper protection.

Wires 30 extend from one end attached to the inner lead fingers 20 in the inner rows on the lead frame 14 to an opposite end attached to the bond pads 34 on the chip 12. The wires 30 are used to provide interconnections between the chip 12 and substrate 40 that provide electrical paths between the external environment of the chip and the integrated circuits on the chip 12. The number of wires 30 and the number of lead fingers 20 may vary depending on the designs of the chip package 10 and chip 12.

Wires 32 extend from one end 31 attached to the outer lead fingers 22 in the outer rows on the lead frame 14 to an opposite end 33 attached to the bond pads 36 on the chip 12. The number and density of wires 32, as well as the number and density of lead fingers 22 and bond pads 36, may vary depending on the need for coverage to provide the tampering protection.

The wires 30, 32 may be comprised of a metal, such as gold or copper, having a fine diameter and may be applied by a wirebonding process. For example, the wirebonding process may rely on a bonding tool that travels to the location of one of the bond pads 36 and attaches a spherical ball at the end 33 of the wire 32 to the bond pad 36 using thermal and/or ultrasonic energy. With the end 33 attached to the bond pad 36, the bonding tool moves in a looping motion toward one of the outer lead fingers 22 while dispensing a length of the wire 32 during movement. A stitch bond is formed that bonds the opposite end 31 of the wire 32 to one of the outer lead fingers 22. In an alternative order of operations, the stitch bond to the outer lead finger 22 may be formed first and the bond to the bond pad 36 may be formed last.

The length of the wire 32 between the end 31 at the lead finger 22 and the end 33 at the bond pad 36 acquires a post-bonded shape related to the movement of the bonding tool in the looping motion. Among other factors, the looping motion determines the elevation or height of the wire 32 along its length between the ends 31, 33. The motion of the bonding tool is programmed such that wires 32 have a higher elevation relative to the surface 38 of the chip 12 than wires 30. In particular, the wires 32 are routed from the outer lead fingers 22 over the wires 30 so that the loops of wires 32 form a canopy or umbrella over the loops of wires 30. During the wirebonding process, the wires 32 may all be formed with the same looping motion such that the wires 32 have the same higher elevation relative to the lower elevation shared by all of the wires 30, and such that the lengths of the loops of the wires 32 are longer than the lengths of the loops of wires 30.

Because of their arrangement about the side edges 26, the wires 32 form a grid or mesh of individual conductors that overlies the wires 30. The wires 30, 32 are located vertically between the substrate 40 to which the lead frame 14 is coupled and the exterior surface 17 of the outer casing 16. Any attempt to penetrate the outer casing 16 in order to access the wires 30 from the exterior surface 17 of the outer casing 16 would require the probe to pass between an adjacent pair of wires 32, to contact one or more of the wires 32, or to have proximity to one or more of the wires 32. With respect to the chip 12, the wires 30 are horizontally and vertically located between the wires 32 and the surface 38 of the chip 12 at locations interior of the outer boundary of the chip 12 established by the side edges 26. In an embodiment, the wires 32 may extend toward the geometrical center of the surface 38 of the chip 12 so as to cover or overlie a majority of the surface 38. As best shown in FIG. 2, the wires 32 may cover the majority of each of the quadrants of the surface 38 of the chip 12 and the wires 30 may be connected to bond pads 34 located in each of these quadrants. With respect to the lead frame 14, the wires 30 are vertically and horizontally located between the wires 32 and exterior surface 17 of the outer casing 16 of the chip package 10.

The chip 12, lead frame 14, and wires 30, 32 are encapsulated inside the outer casing 16. The outer casing 16 may be formed by a chip encapsulation process that, among other operations, applies and cures an epoxy molding compound after the wires 30, 32 are formed by the wirebonding process. The outer casing 16 operates to prevent physical damage or corrosion to the wires 30 and/or chip 12, and also restricts access to the chip 12 and wires 30.

The substrate 40 may include metallization that defines conductive paths 42 used to couple adjacent pairs of the outer lead fingers 22 together. The wires 32 may be daisy-chained or coupled in series by the conductive paths 42 of the substrate 40 and the conductive paths 35 of the chip 12. The interconnections provided by the conductive paths 35 in the BEOL interconnect structure of the chip 12 and interconnections provided by the conductive paths 42 in the substrate 40 allow for simultaneous tamper monitoring of an optimized number of wires 32. The substrate 40 may include additional metallization, such as a ground plane 44 and a power plane 46, that is independent of the conductive paths 42 used to connect adjacent pairs of the bond pads 36.

The wires 32 provide the ability to detect tampering from physical attack. For example, the wires 32 may permit the detection of a physical tamper attempt to remove the chip package 10. As another example, the wires 32 may permit the detection of tampering when the wires 32 are physically contacted by a probe, or another foreign object penetrating into the outer casing 16, in order to attempt to sense the I/O signals being carried by the wires 30. The physical tamper attempt may cause a change in a property of the wires 32, such as a change in the electrical resistance if one or more wires 32 are contacted or a change in the electrical capacitance arising from proximity of a conductive foreign object to one or more wires 32.

Figure 3:
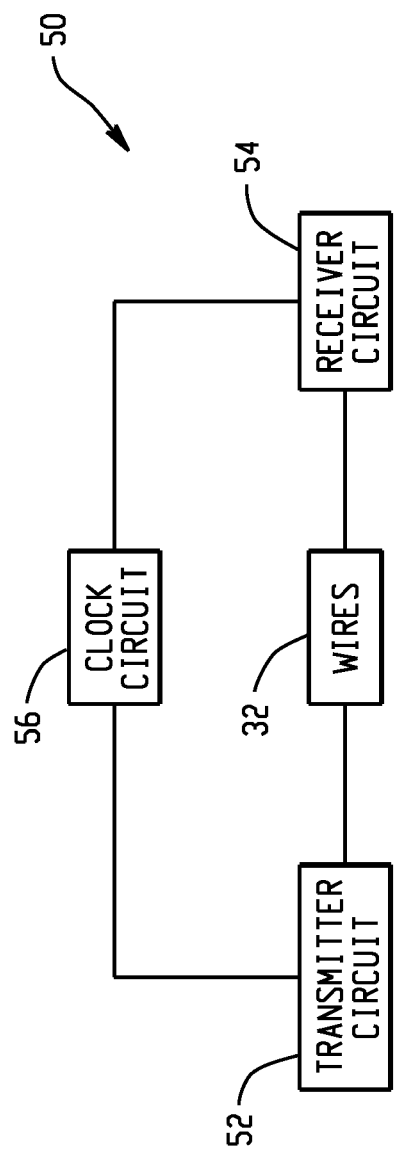
FIG. 3 is a diagrammatic view of a tamper detection system using the wires connecting the chip and package in accordance with an embodiment of the invention.

With reference to FIG. 3 in which like reference numerals refer to like features in FIGS. 1-2 and in accordance with an embodiment of the invention, the wires 32 may be coupled with tamper protection circuitry 50 and may function as sensing devices, in conjunction with the tamper protection circuitry 50, used to detect invasive tampering. Invasive tampering may include, but is not limited to, a breach of the outer casing 16 or removal of the chip 12 from the substrate 40, and may be attempted using probes at a microprobing station. The tamper protection circuitry 50 may be located on the chip 12 or off the chip 12, such as on the substrate 40. The tamper protection circuitry 50 may be configured to deliver electrical signals to the wires to the wires 32 in response to instructions or programmed settings received from an integrated circuit on the chip 12, and/or other instructions or input received from an off-chip source, such as a source carried on the same substrate 40 as the chip 12.

The tamper protection circuitry 50 may include a transmitter circuit 52 configured to launch a static signal or a transient signal as a pulse that travels through the wires 32 to a receiver circuit 54 that is configured to receive the signal that has traveled through the wires 32. Due to the daisy-chaining of the wires 32 in series, the signal may travel through all of the wires 32. The signal may be configured as a pseudo signal that is pulsed to mimic the frequency and irregularity of real signals traveling on wires 30. The use of a pseudo signal may cause difficulty to an attacker in detecting that the wires 32 and the signals on them are being used for tamper protection purposes. The pseudo signals may be particularly effective to defeat eavesdropping on signals carried by wires 30.

The signal supplied by the transmitter circuit 52 may be generated by a voltage detection circuit based on an operational amplifier operated in an open loop state. A varying input voltage may be input as an analog voltage level into a port of the operational amplifier, and a reference voltage input into another port of the operational amplifier. The signal that is output from the operational amplifier to the wires 32 is based on a comparison between the different analog voltage levels, and may be a series of pulses that vary in amplitude from a positive supply rail voltage and a negative supply rail voltage.

The tamper protection circuitry 50 may be configured to determine a delay in the travel time for the signal traveling through the wires 32. To that end, the circuits 52, 54 may be coupled with a clock circuit 56 that provides timing information, and may be operational when the chip 12 is powered. The receiver circuit 54 measures the delay in the signal from the instant of its launch by the transmitter circuit 52 onto the wires 32 to its receipt. The delay for any given signal launched by the transmitter circuit 52 and received at the receiver circuit 54 may be compared with a stored value of delay or a stored window of delay values, which may be determined from an initial test. The delay may be altered outside of the stored value or value range by, for example, a change in the capacitance due to proximity of a probe or other object that has breached the outer casing 16 and that is located to one or more of the wires 32.

Once a physical tampering attempt is detected, the tamper protection circuitry 50 may respond by taking or triggering one or more countermeasures, such as generating an enable signal to initiate a tamper resistance operation. For example, the tamper protection circuitry 50 may be designed to trigger a zeroisation of sensitive data if the wires 32 detect penetration of the outer casing 16 or out-of-specification environmental parameters through a change in resistance or capacitance is detected with the wires 32. Zeroization may entail clearing sensitive stored contents in the memory cells of a memory die or overwriting some or all of the memory cells of a memory die. Alternatively, a processor on the chip 12 may be halted, an alert may be issued to make a system or user aware of the tamper event, or one or more circuit blocks or embedded software may prevent the chip 12 from being fully operational or from functioning at all.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a lead frame with a die attach paddle, a plurality of outer lead fingers, and a plurality of inner lead fingers located between the outer lead fingers and the die attach paddle;
   a chip attached to the die attach paddle, the chip including a surface having an outer boundary, a first plurality of bond pads arranged in a first plurality of rows proximate to the outer boundary, and a second plurality of bond pads that are interior of the outer boundary relative to the first plurality of bond pads, the first plurality of bond pads located on the surface of the chip between the second plurality of bond pads and the outer boundary of the chip, the second plurality of bond pads arranged in a second plurality of rows, and each of the second plurality of rows angled relative to one of the first plurality of rows toward a center of the surface of the chip;

a first plurality of wires each having a first end coupled to one of the outer lead fingers and a second end coupled to one of the second plurality of bond pads;

a tamper detection circuit coupled with the first plurality of wires; and a second plurality of wires extending from the inner lead fingers to the first plurality of bond pads on the chip, the second plurality of wires located between the lead frame and the first plurality of wires.

2. The structure of claim 1 further comprising:
a substrate to which the lead frame is attached, the substrate including a plurality of conductive paths that are arranged to couple adjacent pairs of the outer lead fingers.

3. The structure of claim 1 wherein the chip has an interconnect structure with a plurality of conductive paths, and adjacent pairs of the second plurality of bond pads are connected by one of the conductive paths of the interconnect structure.

4. The structure of claim 3 further comprising:
a substrate to which the lead frame is attached, the substrate including a plurality of conductive paths that are arranged to couple adjacent pairs of the outer lead fingers.

5. The structure of claim 1 wherein the first plurality of wires extend in respective first loops from the outer lead fingers to the second plurality of bond pads, the second plurality of wires extend in respective second loops from the inner lead fingers to the first plurality of bond pads, and the second loops are shorter than the first loops.

6. The structure of claim 1 further comprising:
a substrate to which the lead frame is attached; and
an outer case having an exterior surface,
wherein the lead frame, the chip, the first plurality of wires, and the second plurality of wires are encapsulated inside the outer case, and the lead frame, the chip, the first plurality of wires, and the second plurality of wires are located between the substrate and the exterior surface of the outer case.

7. The structure of claim 1 wherein the inner lead fingers are laterally located between the outer lead fingers and the outer boundary of the chip, the outer boundary of the chip includes a plurality of side edges, and the inner lead fingers and the outer lead fingers are located in one or more rows along one or more of the side edges of the chip.

8. The structure of claim 7 wherein the one or more rows in which the outer lead fingers are located are arranged along all of the side edges of the chip.

9. The structure of claim 7 wherein the one or more rows in which the outer lead fingers are located are arranged along at least two of the side edges of the chip that are opposite from each other.

10. The structure of claim 1 wherein the tamper detection circuit comprises:
a receiver circuit coupled with the first plurality of wires; and
a transmitter circuit coupled with the first plurality of wires, the transmitter circuit configured to supply a signal to the first plurality of wires that travels through the first plurality of wires to the receiver circuit.

11. The structure of claim 10 further comprising:
a clock circuit coupled with the receiver circuit and the transmitter circuit, the clock circuit configured to measure a delay in the signal supplied by the transmitter circuit to the first plurality of wires and received from the first plurality of wires at the receiver circuit.

12. The structure of claim 1 wherein the tamper detection circuit comprises:
a receiver circuit coupled with the first plurality of wires; and
a transmitter circuit coupled with the first plurality of wires, the transmitter circuit configured to supply a pseudo signal to the first plurality of wires that travels through the first plurality of wires to the receiver circuit.

13. The structure of claim 1 wherein the tamper detection circuit is located on the chip, and the second plurality of bond pads couple the first plurality of wires with the tamper detection circuit.

14. The structure of claim 1 wherein the tamper detection circuit is located off the chip, and the outer lead fingers couple the first plurality of wires with the tamper detection circuit.

15. A method for detecting tampering of a chip attached to a lead frame, the chip and the lead frame mounted to a substrate, the method comprising:
transmitting a first signal to a first plurality of wires that extend from a plurality of outer lead fingers on the lead frame to a first plurality of bond pads arranged on a surface of the chip;
transmitting a second signal to a second plurality of wires that extend from a plurality of inner lead fingers on the lead frame to a second plurality of bond pads arranged on the surface of the chip; and
monitoring the first signal with a tamper protection circuit,
wherein the chip includes a surface having an outer boundary, the first plurality of bond pads are arranged in a first plurality of rows proximate to the outer boundary, the second plurality of bond pads are arranged interior of the outer boundary relative to the first plurality of bond pads, the first plurality of bond pads are located on the surface of the chip between the second plurality of bond pads and the outer boundary of the chip, the second plurality of bond pads are arranged in a second plurality of rows, and each of the second plurality of rows is angled relative to one of the first plurality of rows toward a center of the surface of the chip.

16. The method of claim 15 wherein monitoring the first signal with the tamper protection circuit comprises:
detecting a change in capacitance of the first plurality of wires initiated by a tampering attempt.

17. The method of claim 15 wherein monitoring the first signal with the tamper protection circuit comprises:
detecting a change in resistance of the first plurality of wires initiated by a tampering attempt.

18. The method of claim 15 wherein the first signal is a pseudo signal that mimics the second signal.

19. The method of claim 15 wherein the first signal is communicated through a plurality of conductive paths of the chip that couple together adjacent pairs of the first plurality of bond pads and through a plurality of conductive paths of the substrate that couple together adjacent pairs of the outer lead fingers.

\* \* \* \* \*